(12) United States Patent
Timashov et al.

(10) Patent No.: US 10,636,617 B2
(45) Date of Patent: Apr. 28, 2020

(54) AXIAL ELECTRON GUN

(71) Applicant: PATON TURBINE TECHNOLOGIES LLC, Kyiv (UA)

(72) Inventors: Victor Alexandrovich Timashov, Kyiv (UA); Andrey Anatolyevich Tsepkalov, Kyiv (UA); Sergey Ivanovich Ryabenko, Kyiv (UA); Aleksandr Fyodorovich Belyavin, Kyiv (UA); Georgiy Sergeevich Marynskiy, Kyiv (UA); Aleksey Vladislavovich Filippov, Kyiv (UA)

(73) Assignee: PATON TURBINE TECHNOLOGIES LLC, Kyiv (UA)

( * ) Notice: Subject to any disclaimer, the term of this patent is extended or adjusted under 35 U.S.C. 154(b) by 0 days.

(21) Appl. No.: 16/330,140

(22) PCT Filed: Jun. 9, 2017

(86) PCT No.: PCT/UA2017/000064
§ 371 (c)(1),
(2) Date: Mar. 4, 2019

(87) PCT Pub. No.: WO2018/048376
PCT Pub. Date: Mar. 15, 2018

(65) Prior Publication Data
US 2019/0214220 A1    Jul. 11, 2019

(30) Foreign Application Priority Data
Sep. 7, 2016 (UA) .................................. 201609313

(51) Int. Cl.
*H01J 37/065* (2006.01)
*H01J 1/18* (2006.01)

(52) U.S. Cl.
CPC .............. *H01J 37/065* (2013.01); *H01J 1/18* (2013.01)

(58) Field of Classification Search
None
See application file for complete search history.

(56) References Cited

U.S. PATENT DOCUMENTS 3,556,600 A    1/1971   Shoupp et al.
4,057,476 A    11/1977  Dumonte
(Continued)

FOREIGN PATENT DOCUMENTS

DE    3534792 A1    4/1987
EP    0217210 B1    4/1990
(Continued)

OTHER PUBLICATIONS

International Search Report for the corresponding PCT/UA2017000064; International Filing Date: Jun. 9, 2017; dated Sep. 21, 2017; 5 pages.
(Continued)

*Primary Examiner* — Ashok Patel
(74) *Attorney, Agent, or Firm* — Cantor Colburn LLP

(57) ABSTRACT

The invention relates to the field of fabrication of new materials and coatings and may be used in plants designed for electron-beam heating, melting and evaporating of materials in vacuum or reactive gas atmosphere. The disclosed axial electron gun that comprises, in particular, the primary and secondary cathodes and features the figure-shaped holder used for maintaining a stable position of the secondary cathode relative to the electron-beam axis of the axial gun and the pulsed voltage that is applied between the cathodes for electron bombardment of the secondary cathode. The invention ensures an improved stability of process parameters and operation of the electron gun.

2 Claims, 6 Drawing Sheets

(56) References Cited

U.S. PATENT DOCUMENTS

| | | | |
|---|---|---|---|
| 4,084,077 A | 4/1978 | Porazhinsky | |
| 8,159,118 B2 | 4/2012 | Tymashov et al. | |
| 8,878,422 B2* | 11/2014 | Mattausch | H01J 3/025 |
| | | | 313/11 |
| 2015/0187541 A1 | 7/2015 | Dinu-Gurtler | |
| 2016/0079031 A1* | 3/2016 | Aoyama | G01N 23/2252 |
| | | | 348/80 |

FOREIGN PATENT DOCUMENTS

| | | |
|---|---|---|
| GB | 2099625 A | 12/1982 |
| JP | 55151738 | 11/1980 |
| JP | 200526026 A | 1/2005 |
| RU | 1572328 A1 | 1/1995 |
| RU | 2238602 C1 | 10/2004 |
| RU | 130535 U1 | 7/2013 |
| UA | 43927 C2 | 1/2002 |

OTHER PUBLICATIONS

Written Opinion for the corresponding application PCT/UA2017/000064; International Filing Date: Jun. 9, 2017; dated Sep. 21, 2017; 6 pages.

\* cited by examiner

AXIAL ELECTRON GUN

CROSS-REFERENCE TO RELATED APPLICATIONS

This application is a 371 of PCT/UA2017/000064, filed Jun. 9, 2017, which claims benefit of Ukrainian Patent Application No. a 2016 09313 filed Sep. 7, 2016.

TECHNICAL FIELD

The invention herein is in the field of fabrication of new materials and coatings and relates to devices of the electron-beam technology in particular electron guns designed for electron-beam heating, melting and evaporating of materials in vacuum or reactive gas atmosphere.

BACKGROUND OF THE INVENTION

Electron guns with linear thermal cathode have been well known, in particular they were described in the patents for invention of Ukraine No. 21440A (B. A. Movchan, V. A. Timashov, Ye. L. Piiuk), No. 43927 (B. A. Movchan, O. Ya. Gavriliuk), No. 93182 (V. A. Timashov, O. L. Zhdanov, S. I. Ryabenko, A. A. Tsepkalov, S. Berns) and others. Their design features a beam guide, an accelerating anode and a cathode assembly that comprises a frame or cathode plate, insulators, cathode holders, and a focusing electrode. The focusing electrode is placed coaxially with the linear thermal cathode and that is why these electron guns have been named as the axial guns.

In addition, the axial electron guns are widely used in the process of electron-beam deposition of ceramic materials based on $ZrO_2$, $Gd_2O_3$ or other oxides with heat-insulation properties on turbine blades of gas-turbine engines. Fabrication of new materials and coatings in production quantities implies the production of final products with consistent physical and mechanical properties and performance. These requirements may be only complied with if the electron gun maintains process parameters invariable during sufficient time of its service life.

At present, the stable operation of electron guns of known designs can be ensured by using the cathodes made of single-crystal tungsten with precise alignment of the crystal growth axis with respect to the cathode's working surface. This results in high costs of the gun itself as well as the products fabricated with the use of such a gun. If the cathodes made of cheaper polycrystalline tungsten are applied some problems will occur. Under effect of high temperatures the cathode changes its shape and this results in its displacement from the original position in the gun's electron-optical system and changes in focusing and positioning of the electron beam. Due to these effects the electron beam can strike the internal parts of the beam guide with their subsequent melting and flashing of the gun's accelerating anode. At that the stability of parameters and operation reliability of the axial electron gun deteriorate significantly.

Thus, the general deficiency of the well-known designs of electron guns with a linear thermal cathode of polycrystalline tungsten is a low stability of their operation due to misalignment of the electron beam due to high-temperature deformation of the cathode and consequently changes in its position with respect to the optical axis of the electron gun. Hence the aim of the disclosed invention is to improve the reliability of operation of electron guns by ensuring the stability of their parameters. The axial electron gun designed by V. A. Timashov and co-authors of U.S. Pat. No. 8,159,118 assigned to United Technologies Corporation has been selected as a prototype.

DETAILED DESCRIPTION OF THE INVENTION

The disclosed invention's technical task is to ensure a stable electron beam in a wide range of operational voltages of an axial electron gun if an auxiliary cathode of polycrystalline tungsten is used.

The invention discloses an electron gun which comprises, in particular, a primary cathode and a secondary cathode and features a design in which a stable position of the secondary cathode relative to the axial gun's electron-beam axis is maintained with the use of a figure-shaped holder and for electron bombardment of the secondary cathode a pulse voltage is applied between the cathodes. The axial electron gun (FIG. 1) consists of a beam guide (1) that comprises a deflection system (2) and a flange for joining with a water-cooled body of an accelerating anode (3) that contains a focusing coil (4) and a replaceable anode (5). A cathode plate (7) is mounted on the accelerating anode (3) via three high-voltage insulators (6) and a cathode assembly (8) is fixed on the cathode plate (7).

The cathode assembly (FIG. 2) represents a body (9) to which two current leads (11) are attached via two plane ceramic insulators (10) at that the primary tungsten wire cathode (13) protected by thermal shields (14) and a primary focusing electrode (15) is mounted on the current leads (11) with the use of clamps (12). A secondary (main) focusing electrode (19) is also fixed on the body (9) via a coupling nut (16), a thermal shield (17) and a clamp (18). The secondary (main) cathode (20) has a ring-shaped groove on its cylindrical side surface and is mounted between the secondary focusing electrode (19) and the clamp (18) with the use of the figure-shaped holder (21) made of tungsten wire and shaped as a plane regular triangle (FIG. 3a), a quadrangle (FIG. 4b), a pentagon (FIG. 3c) or a hexagon (FIG. 3d). This holder (21) ensures centering and fixing the position of the secondary cathode (20) in the groove of the hole of the secondary focusing electrode (19).

In the electron gun (the prototype described in the U.S. Pat. No. 8,159,118) the secondary cathode is mounted between the focusing electrode and the clamp with the use of the round ring (FIG. 4). An axial electron gun described in the U.S. Pat. No. 3,556,600 assigned to Westinghouse Electric Corporation and similar devices are known. In these devices the secondary cathode is fixed with the use of three thin tungsten torsions in the form of rods of up to 1 mm in diameter which are installed in the corresponding holes on the external side surface of the cathode at angle of 120° with respect to each other (FIG. 5).

The stipulated technical task has been solved by replacing the cathode with the centering ring of round shape or the cathode with the rod torsions by figure-shaped centering holders of plane regular triangle, quadrangle, pentagonal or hexagonal forms. The secondary cathode has an annular groove on the cylindrical side surface. The focusing electrode has also a groove of corresponding depth and diameter of the cathode's mounting plate. The figure-shaped holder is put on the cathode's groove and then the cathode with the holder is put in the focusing electrode's groove where it is fixed by an additional clamp (FIG. 6). The selection of a specifically shaped holder depends on a diameter ratio for the secondary cathode and the focusing electrode. Upon heating the secondary cathode of polycrystalline is deformed. However the holder's faces begin to work as springs that compensate changes in the cathode shape and maintain the cathode's position relative to the electron-beam axis of the axial gun (FIG. 7). The studies performed by the authors have shown that the new figure-shaped holders compensate the changes in sizes of the tungsten cathodes due to both thermal expansion and thermal shrinkage. This technical solution allows the successful application of cheaper tungsten cathodes fabricated by the method of powder pressing.

When the secondary cathode with the annular groove and the fixing electrode shaped as a ring (FIG. 4) is used the frequent disruptions of production process have been observed due to losses of electron beam focusing as a result of deformations of the cathode. At that, in some cases the cathode had fallen out and short-circuited the HV power source that resulted in full stop of the process and even the use of reserve guns was impossible. As a result all parts installed inside the process chamber had to be directed to reprocessing (removal and re-application of the coating). In addition at the end of the process of evaporation of ceramic coating the spurious effect of contamination of gaps between the fixing holder shaped as a ring and the secondary cathode in the area of annual groove was observed. This effect was due to a difference in residual oxygen pressure between the working chamber (the deposition chamber) and the chamber with the guns. Generally the heat-resisting ceramic is dielectric at room temperature. For this reason the formation of dielectric layer in the relatively uniform gaps between the annual holder and the secondary cathode resulted in situation when after the axial gun was turned off and completely cooled the significant period of time was required for destruction of this dielectric layer and restoration of the rated potential −20 kV on the secondary cathode.

When the secondary cathodes fixed by three torsions was used (FIG. 5) the disruption of electron-beam focusing due to deformations of the cathode and the torsions themselves occurred after the brief operation of the electron guns. At that these deformations were accompanied by a change in the position of the cathode relative to the optical axis of the electron gun. Due to the disruption of focusing the increased number of electrons stroke the accelerating anode and caused frequent discharges of the accelerating voltage. At that the rate of evaporation of ceramic ingots significantly decreased and the time of deposition of ceramic coatings on parts increased.

When the secondary cathode was fixed by the annular groove and the holder of plane regular triangular shape (FIG. 6) the significant improvement of stability of operation of the axial electron gun was achieved for the whole design service life of the cathode.

Until the end of the design service life of the gun a certain deterioration of the electron beam focusing has been observed due to physical wear and tear of the cathode. However the focusing as well as the frequency of discharges of the accelerating voltage remained within the acceptable limits. The use of the holder of plane regular triangular shape allows a geometric decrease in gaps between the holder and the cathode. As a result a significant reduction of the effect of spurious deposition of coatings on gaps was achieved and losses of time for removal of the dielectric spurious layer before running up to the ratings after complete cooling of the axial electron gun were reduced significantly as compared with the holder of circular shape.

Further studies into optimization of the holder's shape have resulted in a conclusion that the application of the cathode holders of regular shapes (quadrangle, pentagonal or hexagonal) also ensures the cathode's service life of no less than 100 hours. At that the failure probability of the electron gun was no more than 10 percent in all cases. It has been established that for the quadrangle, pentagonal or hexagonal holder shapes the lack of obvious correlation between the holder shape and the failure probability for the axial gun was exclusively due to the quality of tungsten wire and the technological effectiveness of holder making. In this case the term "technological effectiveness" relates to the ability of equipment to ensure the specified angle of bending of tungsten wire of the specified diameter without formation of surface cracks when the holders of plane regular geometric shapes (triangles, quadrangles, pentagons or hexagons) are made.

The experiments have also established the following. There is an optimal shape of the holder of the secondary cathode depending on its diameter (and as a consequence, its mass). It has been established and shown in practice that in terms of the relationship "the holder shape—the operational reliability of the axial electron gun" both at the time of starting the process and at the stage of steady-state process of intensive evaporation of ceramic material and taking into account the spurious deposition of ceramic layers in the gaps between the holder and the secondary cathode at residual oxygen pressure in the gun chamber of no more than 0.67 Pa ($5 \times 10^{-3}$) torr the most effective combinations of cathode diameters and holder shapes are as follows:

cathode diameter of 8-10 mm-triangle;
cathode diameter of 10-14 mm-triangle or quadrangle;
cathode diameter of 14-16 mm-quadrangle;
cathode diameter of 16-18 mm-pentagon;
cathode diameter of 18 mm and more-hexagon.

Usually the stabilized constant voltage is used for electron bombardment of a secondary cathode. However, due to small spacing between the primary cathode (13) and the secondary cathode (20) and insufficient level of vacuum spontaneous ion-plasma discharges can occur between the cathodes. These discharges will result in uncontrolled heating of the secondary cathode and uncontrolled rise of the electron gun beam current. For preventing this process we propose to apply intermittent voltage for electron bombardment of the secondary cathode (20). this voltage will quench newly originated plasma arc discharges and uncontrolled processes within the axial electron gun will be prevented and the operation of the electron gun will be more stable. Due to a relatively large mass of the secondary cathode (20) the intermittent bombarding voltage does not cause the corresponding pulsed changes of its temperature and as a result the pulsation of the beam current of the axial electron gun will not occur.

BRIEF DESCRIPTION OF DRAWINGS

The disclosed invention will be better understood but not restricted by reference to the drawings which show the following.

PREFERRED EMBODIMENT

Figure 1:
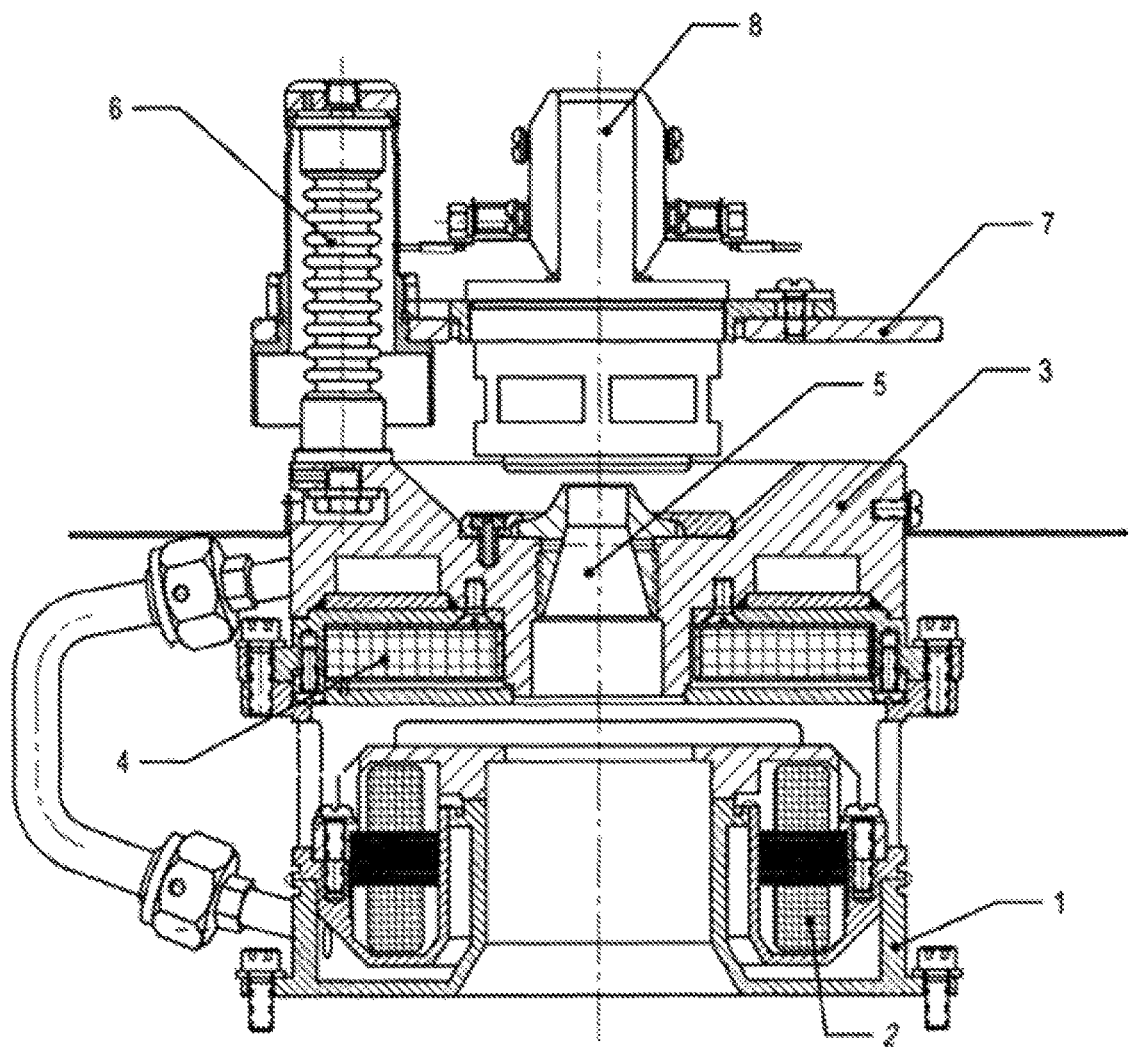
FIG. 1—Main structural elements of the axial electron gun, the vertical section.
Figure 2:
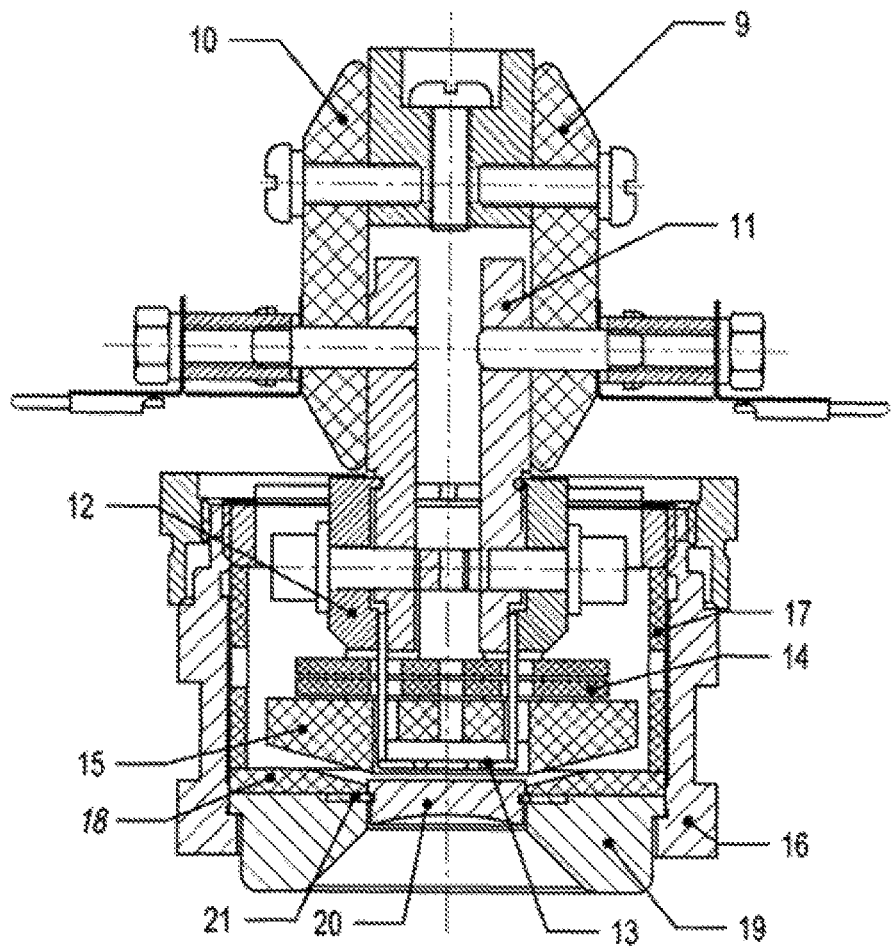
FIG. 2—Design of the cathode assembly, the vertical section.
Figure 3A:
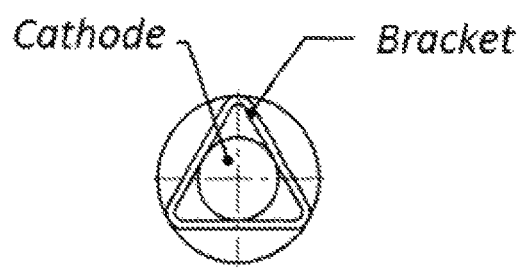
FIG. 3a-d—Location of a holder shaped as a plane regular polygon relative to the secondary cathode.
Figure 3B:
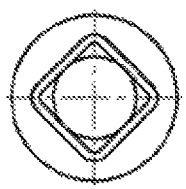
Figure 3C:
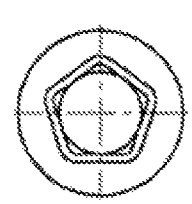
Figure 3D:
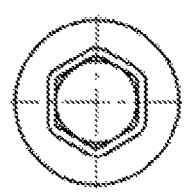
Figure 4:
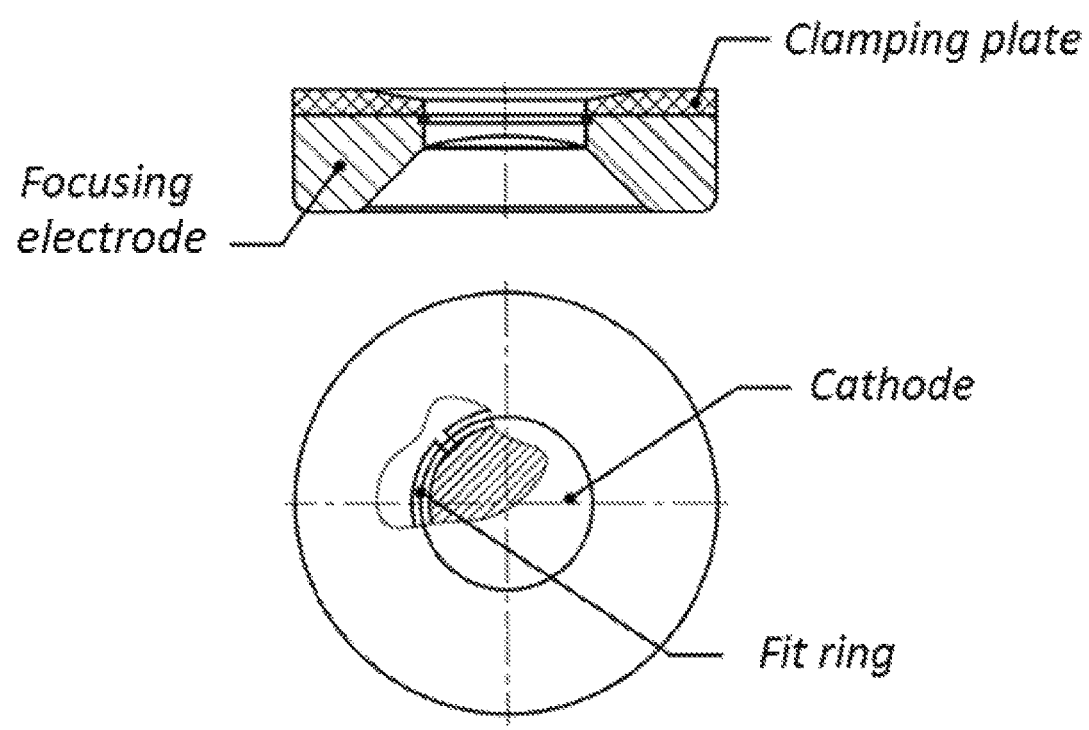
FIG. 4—Secondary cathode, diagram of installation with the use of O-ring, the vertical and horizontal sections.
Figure 5:
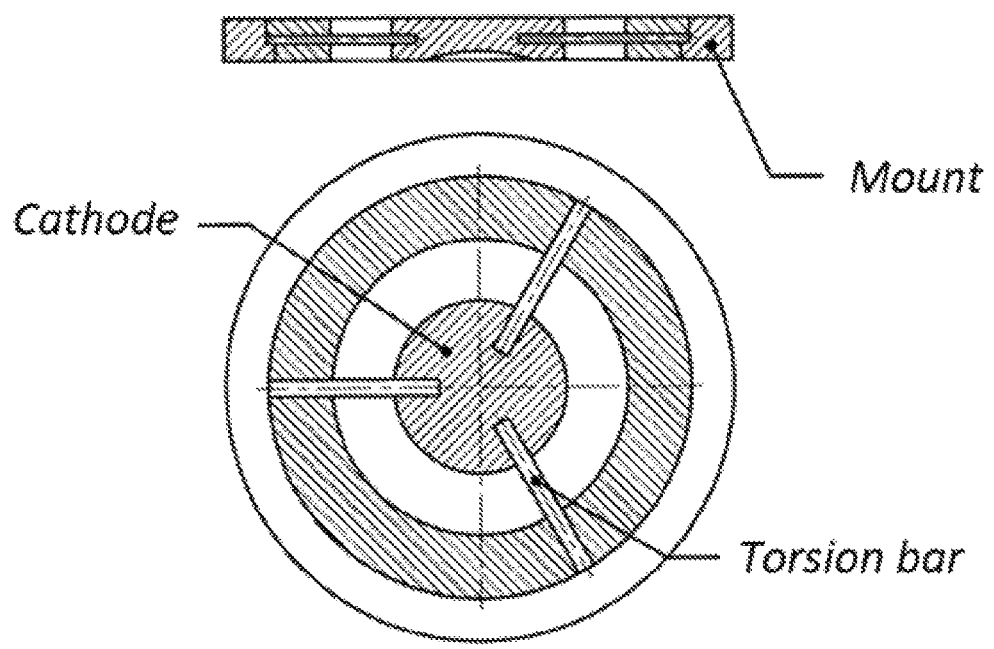
FIG. 5—Secondary cathode, diagram of installation with the use of rod torsion holders, the vertical and horizontal sections.
Figure 6:
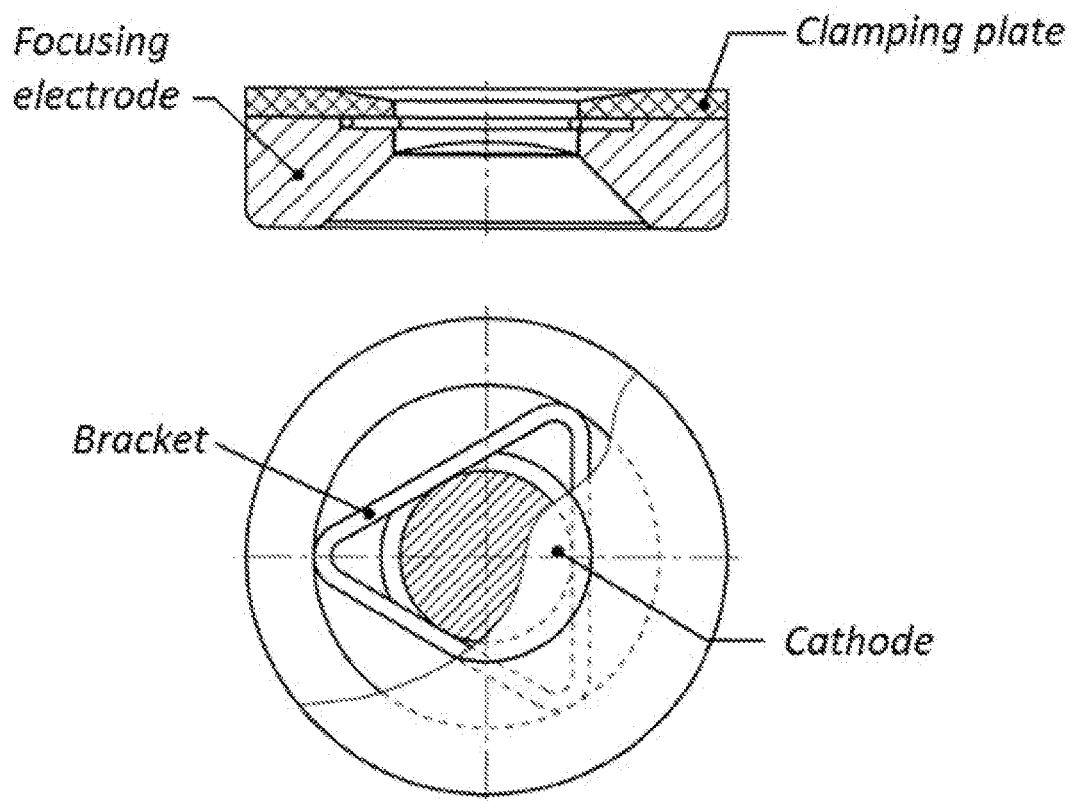
FIG. 6—Secondary cathode, diagram of installation with the use of a holder shaped as a plane regular triangle, the vertical and horizontal sections.
Figure 7:
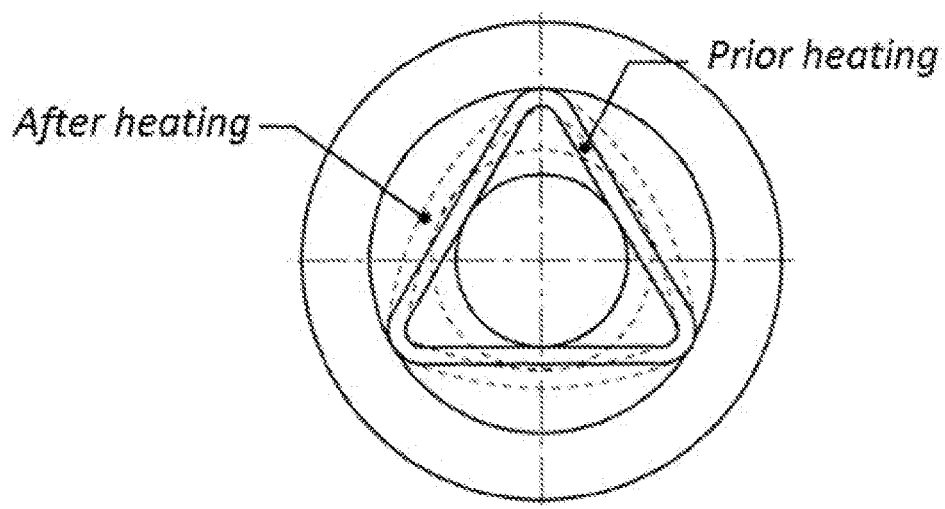
FIG. 7—Compensation of high-temperature deformations of the secondary cathode with the use of a holder shaped as a plane regular triangle.

The axial electron gun (FIG. 1) comprising the cathode assembly (FIG. 2) operates as follows. Alternating voltage 4-10 VAC is applied to the current leads (11) so the heating current in the range 20 to 80 A runs through and heats the primary tungsten wire cathode (13). Bombarding voltage in the range −0.5 to −2.5 kV is applied between the primary cathode (13) and the secondary cathode (20). Electrons emitted from the primary cathode bombard and heat the secondary cathode to the temperature of about 2800° C. The intensity of heating of the secondary cathode (20) depends on the heating current of the primary cathode (13) and the bombarding voltage. Accelerating voltage in the range 18 to 30 kV is applied between the secondary cathode (20) fixed by the holder shaped as a plane regular polygon and the anode (5). Under effect of this voltage electrons leave the cathode (20), are focused by the focusing electrode (15) and run to the beam guide of the axial electron gun (1) through the hole in the accelerating anode (5). An electron beam formed in such a manner is additionally focused by the focusing coil (4) and deflected by the deflecting system (2) in a proper direction. The deflecting system also performs scanning of the electron beam. In that way by changing the value of heating current of the primary cathode (13) it is possible to control the values of bombarding current of the secondary cathode (20) and also the gun beam current.

INDUSTRIAL APPLICABILITY

Figure 8:
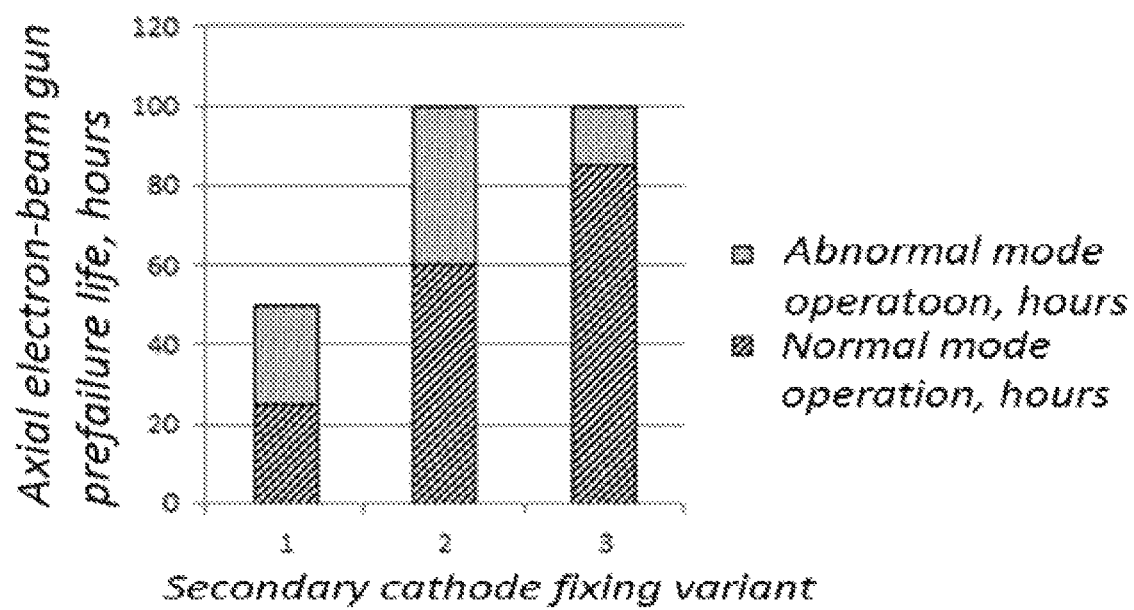
FIG. 8—Diagram of relationship between the running time of the axial electron gun and the method of fastening of the secondary cathode.

FIG. 8 shows the diagram of relationship between the running time in hours of the axial electron gun and the fastening method of the second cathode.

1. Fastening of the cathode by the holder shaped as a ring.
2. Fastening of the cathode by three separate torsions.
3. Fastening of the cathode by the disclosed holder of regular triangular shape.

The presented diagram shows that the disclosed technical solution ensures an increase in the running time of the axial electron gun operated in the normal mode by a factor of three if compared with the prototype and by a factor of 1.5 if compared with the fastening of the secondary cathode by torsions.

The invention claimed is:

1. An axial electron gun comprising a primary cathode, a secondary cathode, an accelerating anode, a beam guide, a focusing coil, a deflecting system, a power supply system and a vacuum system characterized in that a figure-shaped holder of the secondary cathode is made of polycrystalline tungsten wire in the form of a plane regular triangle, quadrangle, pentagon or hexagon and is disposed in a ring groove formed on a cylindrical side surface of the secondary cathode.

2. The axial electron gun as claimed in claim 1 in which for electron bombardment of the secondary cathode the pulsed voltage is applied between the secondary cathode and the primary cathode.

\* \* \* \* \*